(12) United States Patent
Fischer et al.

(10) Patent No.: US 9,425,146 B2
(45) Date of Patent: Aug. 23, 2016

(54) SEMICONDUCTOR STRUCTURE AND METHOD FOR MAKING SAME

(75) Inventors: Thomas Fischer, Regensburg (DE); Juergen Foerster, Tegernheim (DE); Werner Robl, Regensburg (DE); Andreas Stueckjuergen, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 563 days.

(21) Appl. No.: 12/891,865

(22) Filed: Sep. 28, 2010

(65) Prior Publication Data

US 2012/0074572 A1 Mar. 29, 2012

(51) Int. Cl.
| H01L 23/532 | (2006.01) |
|---|---|
| H01L 21/3213 | (2006.01) |
| H01L 21/768 | (2006.01) |
| H01L 23/00 | (2006.01) |

(52) U.S. Cl.
CPC ... *H01L 23/53238* (2013.01); *H01L 21/32134* (2013.01); *H01L 21/76838* (2013.01); *H01L 21/76885* (2013.01); *H01L 24/03* (2013.01); *H01L 24/05* (2013.01); *H01L 2221/1078* (2013.01); *H01L 2224/03614* (2013.01); *H01L 2224/03622* (2013.01); *H01L 2224/05166* (2013.01); *H01L 2224/05186* (2013.01); *H01L 2224/05193* (2013.01); *H01L 2224/05647* (2013.01); *H01L 2924/0105* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01079* (2013.01)

(58) Field of Classification Search
CPC .................. H01L 21/32134; H01L 23/53238; H01L 21/76838; H01L 21/76885
USPC .................................................. 438/689, 754
See application file for complete search history.

(56) References Cited

U.S. PATENT DOCUMENTS

| 5,300,813 | A | 4/1994 | Joshi et al. | |
|---|---|---|---|---|
| 5,738,931 | A * | 4/1998 | Sato | G11B 5/313 174/256 |
| 5,792,672 | A * | 8/1998 | Chan et al. | 438/622 |
| 5,903,053 | A | 5/1999 | Iijima et al. | |
| 6,394,114 | B1 * | 5/2002 | Gupta et al. | 134/3 |
| 8,025,812 | B2 * | 9/2011 | Bailey et al. | 252/79.1 |
| 2007/0164430 | A1 | 7/2007 | Lin et al. | |
| 2008/0264898 | A1 | 10/2008 | Bailey et al. | |
| 2008/0286701 | A1 | 11/2008 | Rath et al. | |
| 2009/0140421 | A1 * | 6/2009 | Lin et al. | 257/737 |
| 2009/0174076 | A1 | 7/2009 | Sasaki et al. | |
| 2012/0261817 | A1 * | 10/2012 | Do et al. | 257/737 |

OTHER PUBLICATIONS

English machine translation of KR20040047634, published Jun. 5, 2004.*
English abstract of KR20040047634, published Jun. 5, 2004.*

* cited by examiner

*Primary Examiner* — Laura Menz
*Assistant Examiner* — Candice Y Chan
(74) *Attorney, Agent, or Firm* — Slater Matsil, LLP (57) ABSTRACT

One or more embodiments relate to a method for making a semiconductor structure, comprising: providing a workpiece; forming a barrier layer over the workpiece; forming a separation layer over the barrier layer; forming a conductive layer over the separation layer; and wet etching the conductive layer.

20 Claims, 4 Drawing Sheets

SEMICONDUCTOR STRUCTURE AND METHOD FOR MAKING SAME

TECHNICAL FIELD

One or more embodiments of the present invention relate to semiconductor structures and methods for making semiconductor structures.

BACKGROUND

Patterned wet chemical etching may come with an undercut of the etched material. Compared with the masking pattern, the etched pattern may end up with a reduced dimension. New methods are needed to limit the extent of the undercut.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
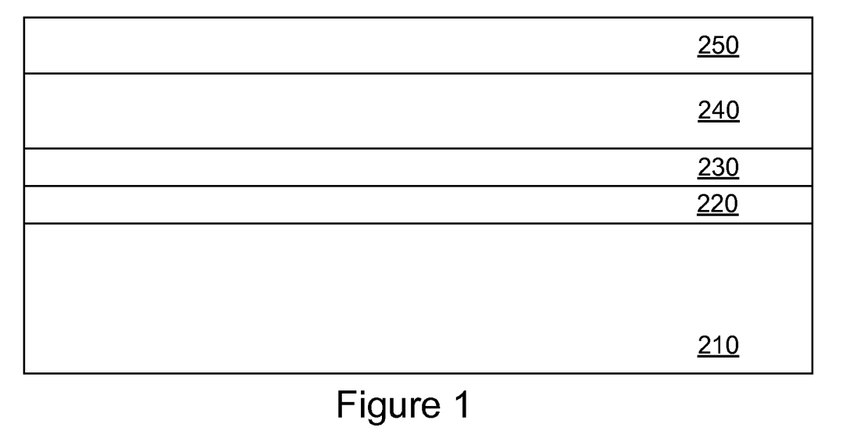
FIGS. 1 through 3 show a method of making a semiconductor structure in accordance with an embodiment of the present invention.

FIG. 1 shows a workpiece 210. A barrier layer 220 may be formed over the workpiece 210. The barrier layer 220 may be formed by a deposition process. The deposition process may comprise a chemical vapor deposition process and/or a physical vapor deposition. In one or more embodiments, the barrier layer 220 may be a conductive layer. In one or more embodiments, the barrier layer 220 may be a metallic layer. The barrier layer 220 may include one or more conductive materials. The barrier layer 220 may include one or more metallic materials. The barrier layer 220 may, for example, include a metal and/or a metallic alloy and/or a compound (for example, a metallic compound). In one or more embodiments, the barrier layer 220 may be formed in direct contact with the workpiece 210.

In one or more embodiments, a metallic alloy may comprise at least two different metallic elements. In one or more embodiments, a metallic alloy may comprise at least one metallic element and a least one non-metallic element.

In one or more embodiments, the barrier layer 220 may be a single homogeneous layer. In one or more embodiments, the barrier layer may include combinations (e.g. mixtures) of two or more materials. In one or more embodiments, the barrier layer 220 may comprise a stack of two or more sub-layers. In one or more embodiments, at least two of the sub-layers of the stack may include different materials.

The barrier layer 220 may comprise one or more of the periodic table chemical elements selected from the group consisting of Ti (titanium), Ta (tantalum), W (tungsten), and N (nitrogen). In one or more embodiments, the barrier layer may comprise the chemical element W (tungsten). The chemical element W (tungsten) may exist in any form, for example, as tungsten metal, a tungsten alloy and/or a tungsten compound. Hence, the barrier layer 220 may comprise a W-containing material which comprises the chemical element W (tungsten). The W-containing material may include, for example, tungsten metal and/or a metallic alloy (e.g. tungsten alloy) and/or a tungsten compound.

As examples, the barrier layer 220 may comprise one or more materials selected from the group consisting of titanium metal, tungsten metal, tantalum metal, titanium alloy, tungsten alloy, tantalum alloy, titanium-tungsten alloy (TiW), titanium nitride (e.g. TiN), tantalum nitride (e.g. TaN), and tungsten nitride (e.g. WN). The barrier layer may include combinations (e.g. mixtures) of two or more materials.

In one or more embodiments, the barrier layer 220 may comprise a titanium-tungsten alloy. In one or more embodiments, the atomic percentage of the W (tungsten) component of the alloy may be about 60% or more. In one or more embodiments, the atomic percentage of the W (tungsten) component of the alloy may be about 70% or more. In one or more embodiments, the atomic percentage of the W (tungsten) component of the alloy may be about 75% or more. In one or more embodiments, the atomic percentage of the tungsten component of the alloy may be about 80% or more.

In one or more embodiments, barrier layer 220 may be used to suppress the diffusion of certain chemical elements (such as the chemical element Cu (copper)). In one or more embodiments, the barrier layer 220 may also be used for stress reduction. In one or more embodiments, the barrier layer 220 may also be used for adhesion purposes.

In one or more embodiments, a separation layer 230 may be formed over the barrier layer 220. In one or more embodiments, the separation layer 230 may be formed in direct contact with the barrier layer 220. In one or more embodiments, the separation layer 230 may physically separate the barrier layer 220 from the conductive layer 240 which will be formed over it. Hence, in one or more embodiments, the separation layer 230 may be between the barrier layer 220 and the conductive layer 240. In one or more embodiments, there is no direct contact between the barrier layer 220 and the conductive layer 240.

In one or more embodiments, the separation layer 230 may be a homogeneous layer (for example, a single homogeneous layer). In one or more embodiments, the separation layer 230 may include a combination or mixture of two or more different materials. In one or more embodiments, it is possible that the separation layer 230 have a graded composition. In one or more embodiments, the separation layer 230 may include two or more sub-layers. Two or more of the sub-layers may comprise a different material.

In one or more embodiments, the separation layer 230 may be in direct contact with the barrier layer 220. In one or more embodiments, one or more additional layers may be between the barrier layer 220 and the separation layer 230. The additional layers may, for example, be additional barrier layers and/or additional separation layers.

In one or more embodiments, the separation layer 230 may be a barrier layer (for example, it may function as a barrier layer).

In one or more embodiments, the separation layer 230 may essentially lack the chemical element W (tungsten). In one or more embodiments, the separation layer 230 may comprise (or may consist essentially) of a material that essentially lacks W (tungsten).

In one or more embodiments, the top surface of the separation layer 230 may essentially lack the chemical element W (tungsten). In one or more embodiments, it is possible that the separation layer 230 include a graded composition. It may be possible that the top surface of the separation layer 230 essentially lacks W (tungsten) while the separation layer 230 includes W (tungsten) below the top surface.

In one or more embodiments, it is possible that the separation layer 230 includes two or more sub-layers. It is possible that the uppermost sub-layer essentially lacks the chemical element W (tungsten) such that the top surface of the separation layer 230 essentially lacks the chemical element W (tungsten). In one or more embodiments, it may be possible that one or more of the other sub-layers includes W (tungsten).

In one or more embodiments, the separation layer 230 may be a conductive layer. The separation layer 230 may comprise one or more conductive materials. In one or more embodiments the separation layer 230 may be a metallic layer. In one or more embodiments, the separation layer may comprise one or more metallic materials.

In one or more embodiments, the separation layer 230 may be a semiconductive layer. In one or more embodiments, the separation layer 230 may be a dielectric layer. The separation layer 230 may comprise a conductive material and/or semiconductive material and/or dielectric material.

In one or more embodiments, the separation layer 230 may comprise one or more conductive materials. The separation layer 230 may comprise one or more metallic materials. The separation layer 230 may comprise a metal and/or a metallic alloy and/or compound (e.g. metallic compound). In one or more embodiments, the separation layer 230 may comprise one or more materials from the group consisting of titanium metal, tantalum metal, titanium alloy, tantalum alloy, titanium nitride (e.g. TiN), and tantalum nitride (e.g. TaN). As noted, combinations or mixtures of two or more materials may be used.

In one or more embodiments, a metallic alloy may comprise two or more metallic elements. In one or more embodiments, a metallic alloy may comprise a metallic element and a non-metallic element.

In one or more embodiments, the separation layer 230 may comprise (or may consist essentially of) titanium metal. In one or more embodiments, the separation layer 230 may comprise a material which is different from that of the barrier layer 220. In one or more embodiments, the separation layer 230 may comprise a material having a composition different from that of the barrier layer 220.

In one or more embodiments, the barrier layer 220 may comprise (or may consist essentially of) titanium-tungsten alloy (e.g. TiW). In one or more embodiments, the separation layer 230 may comprise (or may consist essentially of) titanium metal.

In one or more embodiments, the separation layer 230 may comprise the chemical element C (carbon). The chemical element C (carbon) may be in the form of a carbon allotrope. The carbon allotrope may, for example, be graphite, amorphous carbon, carbon nanotube, fullerene, etc. In one or more embodiments, the C (carbon) may be chemical vapor deposition deposited. The temperature of the chemical vapor deposition may be about 175° C. or less.

In one or more embodiments, the separation layer 230 may comprise a dielectric material. The dielectric material may include an oxide and/or nitride and/or an oxynitride. In one or more embodiments, the oxide may be silicon oxide.

In one or more embodiments, the separation layer 230 may itself be an additional barrier layer. As an additional barrier layer, the separation layer 230 may include one or more materials different from barrier layer 220.

Still referring to FIG. 1, a conductive layer 240 may be formed over the separation layer 230. In one or more embodiments, the conductive layer 240 may be formed in direct contact with the separation layer 230. In one or more embodiments, the conductive layer 240 may be a metallic layer. The conductive layer 240 may comprise one or more conductive materials. The conductive layer 240 may comprise one or more metallic materials. The conductive layer 240 may, for example, comprise a metal and/or a metallic alloy and/or a compound (e.g. a metallic compound). The conductive layer may comprise a homogeneous material and/or a heterogeneous material.

The conductive layer 240 (or a material of the conductive layer 240) may comprise one or more of the periodic table chemical elements selected from the group consisting of Cu (copper), Al (aluminum), Ag (silver), Au (gold), W (tungsten), Co (cobalt), Ti (titanium), and Ta (tantalum). The conductive layer 240 may include one or more materials from the group consisting of copper metal, copper alloy, aluminum metal, aluminum alloy, silver metal, silver alloy, gold metal, gold alloy, tungsten metal, tungsten alloy, titanium metal, titanium alloy, tantalum metal, and tantalum alloy. In one or more embodiments, it is possible that the conductive layer includes a metallic alloy that comprises the chemical element Cu (copper).

In one or more embodiments, the conductive layer 240 may be a homogeneous layer. In one or more embodiments, the conductive layer may include a combination (e.g. mixture) of two or more materials. In one or more embodiments, the conductive layer 240 may include two or more sub-layers. Two or more of the sub-layer may include different materials.

In one or more embodiments, the conductive layer 240 includes the chemical element Cu (copper). The Cu (copper) may be in any form such as copper metal and/or a copper alloy. Hence, in one or more embodiments, the conductive layer 240 may comprise copper metal. In one or more embodiments, the conductive layer 240 may comprise a copper alloy. In one or more embodiments, the conductive layer 240 may include a metallic alloy that includes the chemical element Cu (copper). In one or more embodiments, the metallic alloy may include more than 50% atomic percentage of Cu (copper). In one or more embodiments, the metallic alloy may include less than 50% atomic percentage of Cu (copper).

Hence, in one or more embodiment, the conductive layer 240 may comprise a Cu-containing material. The Cu-containing material may be any material, in any form, that includes the chemical element Cu (copper). The Cu-containing material may include, for example, copper metal, a metallic alloy (e.g. a copper alloy) and/or a copper compound. The copper compound may be a metallic copper compound.

The conductive layer 240 may be formed by a deposition process. The deposition process may include a chemical vapor deposition process and/or a physical vapor deposition process. The conductive layer 240 may be formed by a sputtering process. In one or more embodiments, the conductive layer 240 may be formed by an electroplating process. In one or more embodiments, the conductive layer 240 may be formed by an electroless plating process.

In one or more embodiments, the conductive layer 240 may be formed in direct contact with the separation layer 230. In one or more embodiments, the separation layer 230 may essentially lack the chemical element W (tungsten). In one or more embodiments, at least in its top surface of the separation layer 230 may essentially lack the chemical element W (tungsten). In one or more embodiments, the conductive layer 240 is not in direct contact with the chemical element W (tungsten). In one or more embodiments, the conductive layer 240 may include the chemical element Cu (copper). In one or more embodiments, there may be no interaction (for example, a chemical interaction such as a chemical reaction) between the conductive layer 240 and the chemical element W (tungsten). In one or more embodiments, should the conductive layer 240 include the chemical element Cu (copper), then in one or more embodiments, there may be no interaction (for example, a chemical interaction such as a chemical reaction) between the chemical element Cu (copper) of the conductive layer 240 and the chemical element W (tungsten).

Still referring to FIG. 1, a masking layer 250 may be formed over the conductive layer 240. In one or more embodiments, the masking layer 250 may be formed in direct contact with the conductive layer 240. In one or more embodiments, the masking layer 250 may be a photoresist layer. In one or more embodiments, the photoresist layer 250 may be a positive photoresist layer. In some embodiments, the photoresist layer 250 may be a negative photoresist layer. In one or more embodiments, a multi-layer resistance system may be used. Likewise, in some embodiments, a B-ARC resist system may be used or a TOP-ARC resist system may be used. In some embodiments, a foil resist may be used. In some embodiments, an organic photoresist may be used.

Figure 2:
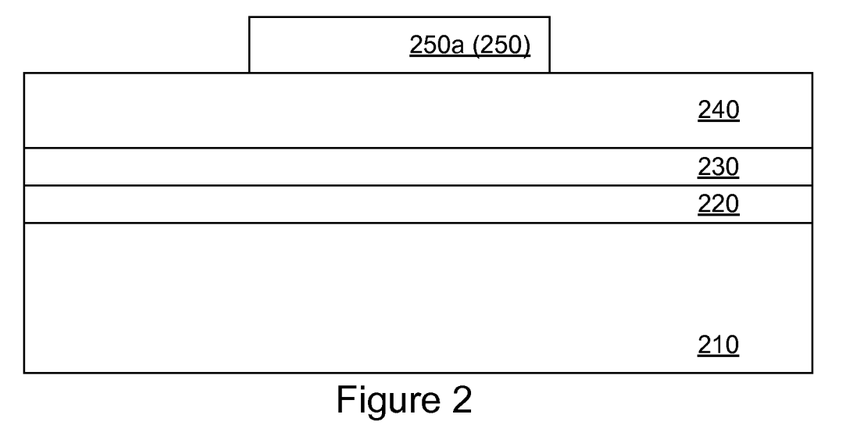

Referring to FIG. 2, in one or more embodiments, the masking layer 250 may be patterned to form a mask 250a. For example, a portion of the masking layer 250 may be removed to form a mask 250a which is a portion of masking layer 250.

Figure 3:
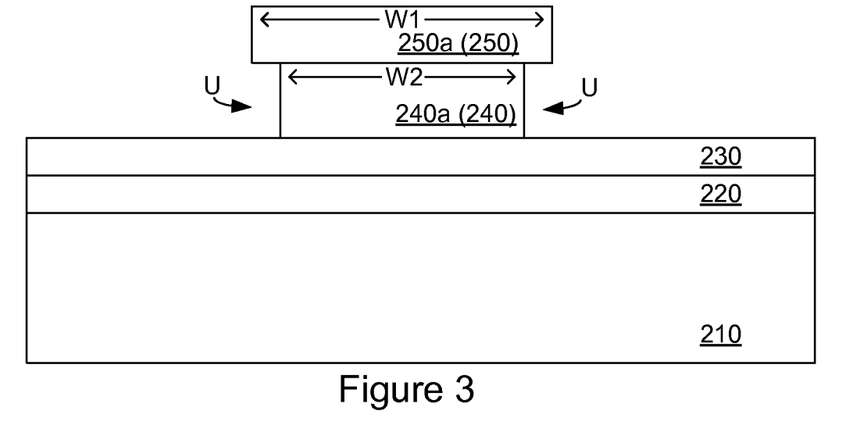

Referring to FIG. 3, the conductive layer 240 may be etched to form the conductive layer 240a which is a portion of conductive layer 240. In one or more embodiments, the etching process may include a wet etching process. In one or more embodiments, the wet etching process may comprise an etchant. The etchant may comprise phosphoric acid. In one or more embodiments, the etchant may comprise phosphoric acid and/or acetic acid and/or nitric acid. The etchant may be a mixture comprising phosphoric acid and/or acetic acid and/or nitric acid. In one or more embodiments, the mixture may comprise about 49% phosphoric acid, 35% acetic acid and 1.5% nitric acid.

The etchant may comprise phosphoric acid. The etchant may comprise about 49% phosphoric acid. The etchant may comprise acetic acid. The etchant may comprise about 35% atomic weight acetic acid. The etching process may comprise nitric acid. The etchant may comprise about 1.5% atomic weight nitric acid. In one or more embodiments, the remainder of the etchant may comprise water.

In one or more embodiments, the etchant may comprise at least 10% acid. In one or more embodiments, the etchant may comprise at least 15% acid. In one or more embodiments, the etchant may comprise at least 25% acid. In one or more embodiments, the etchant may comprise at least 50% acid. In one or more embodiments, the etchant may comprise at least 75% acid.

In one or more embodiments, the etchant may comprise at least 25% water. In one or more embodiments, the etchant may comprise at least 50% water. In one or more embodiments, the etchant may comprise at least 75% water. In one or more embodiments, the etchant may comprise at least 50% water. In one or more embodiments, the etchant may comprise at least 25% acid.

In one or more embodiments, the etchant used may etch through the conductive layer 240. In one or more embodiments, the etchant may stop essentially on the separation layer 230. In one or more embodiments, essentially none of the separation layer 230 may be etched. In one or more embodiments, the etch rate of the etchant on the conductive layer 240 may be greater than the etch rate of the etchant on the separation layer 230. In one or more embodiments, the etch rate of the etchant on the separation layer 230 may be essentially zero. In one or more embodiments, the etchant used may etch the conductive layer 240 selective to the separation layer 230.

In one or more embodiments, the etching process used to etch the conductive layer 240 may be a wet etching process.

In one or more embodiments, the etching process (for example, a wet etching process) used to etch the conductive layer 240 may include an isotropic etching process.

In one or more embodiments, it may be possible that the etching process used to etch the conductive layer 240 may include a dry etching process. In one or more embodiments, the etching process used to etch the conductive layer 240 may include a dry etching process and a wet etching process. In one or more embodiments, the dry etching process may occur before the wet etching process.

Referring to FIG. 3, it is seen that, as a result of the etching process (for example, as a result of the wet etching process) of the conductive layer 240, the conductive layer 240 may be patterned to form a conductive layer 240a (e.g. a patterned conductive layer 240a). The conductive layer 240a is a portion of conductive layer 240. Because of the wet etching, the conductive layer 240a may have an undercut U. In one or more embodiments, the extent of undercut U may correspond to the difference between the lateral dimension (e.g. width) W1 of the mask 250a and the lateral dimension (e.g. width) W2 of the etched conductive layer 240a.

While not wishing to be bound by theory, the extent of the undercut U may possibly at least partially be due to the interaction between the materials of the conductive layer 240 and materials that may be in direct contact with the conductive layer 240, particularly during the etching process. This interaction which may cause a chemical reaction to occur (e.g. an electrochemically accelerated chemical reaction) between the conductive layer 240 and the materials which may be in direct contact with the conductive layer 240.

In one or more embodiments, the materials of the separation layer 230 and/or the conductive layer 240 and/or the etchant may be chosen so as to provide a conductive layer 240a with a reduced undercut. In one or more embodiments, the materials of the separation layer 230 and/or the conductive layer 240 and/or the etchant may be chosen so that the etching process creates a conductive layer 240a having substantially no undercut.

Referring to FIG. 3, the separation layer 230 may prevent the direct contact of the conductive layer 240 with the barrier layer 220. For example, in one or more embodiments, the barrier layer 220 may comprise the chemical element W (tungsten), possible in the form of titanium-tungsten alloy (e.g. TiW). In one or more embodiments, the separation layer 240 may comprise a material that essentially lacks the chemical element W (tungsten). For example, the separation layer may comprise titanium metal. Hence, in this case, the separation layer may prevent, the conductive layer 240 from being in direct contact with the W (tungsten) of the barrier layer.

It is noted that the conductive layer 240 may comprise the chemical element Cu (copper), which may be in the form of copper metal and/or a copper alloy. As an example, in one or more embodiments, the barrier layer 220 may comprise the chemical element W (tungsten), which may be in the form of titanium-tungsten alloy. The separation layer 230 may thus help to prevent the W (tungsten) of the barrier layer 220 from directly contacting the chemical element Cu (copper) of the conductive layer 240 (for example, while the conductive layer 240 is being etched). While not wishing to be bound by theory, the separation of the barrier layer 220 from the conductive layer 240 may cause a change in the etching chemistry. The physical separation of the barrier layer 220 from the conductive layer 240 may cause a change in the chemical reaction between the barrier layer 220 and the conductive layer 240. In one or more embodiments, this may help to reduce the undercut or may substantially eliminate the undercut in the conductive layer 240a. In one or more embodiments, the separation layer 230 may help to prevent the conductive layer 240 from directly contacting the chemical element W (tungsten) during the wet etching process. Hence, in one or more embodiments, the conductive layer 240 may directly contact essentially no W (tungsten) during the wet etching process.

Referring to FIG. 3, the barrier layer 220 may have a thickness between about 5 nm and about 300 nm. In one or more embodiments, the barrier layer 220 may have a thickness of about 5 nm (nanometers) or greater, 50 nm or greater, 100 nm or greater, or 200 nm or greater. As an example, a barrier layer 220 may be about 200 nm.

The separation layer 230 may have a thickness between about 10 nm and about 500 nm. In one or more embodiments, the separation layer 230 may have a thickness of about 10 nm or greater, 50 nm or greater, 100 nm or greater, 200 nm or greater, or 300 nm or greater. As an example, the separation layer 230 may have a thickness of about 300 nm.

The conductive layer 240 may have a thickness between about 500 nm and about 1500 nm. As an example, the conductive layer 240 may have a thickness of about 1000 nm.

In one or more embodiments, the conductive layer 240a may, for example, be a conductive line (for example, a metal line) of a metallization level. In one or more embodiments, a conductive line (for example, a metal line) may be useful for directing electrical signals primarily in a horizontal direction. However, it is understood that the conductive layer 240a may serve as any conductive feature.

Figure 4:
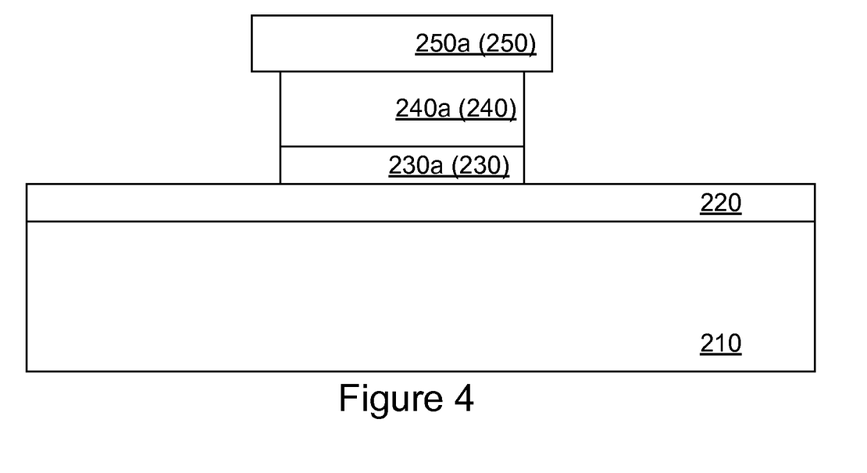
FIG. 4 shows the result of patterning the separation layer of the structure shown in FIG. 3.

Referring to FIG. 4, after the etch of the conductive layer 240 to form conductive layer 240a, the separation layer 230 shown in FIG. 3 may be patterned to form the separation layer 230a (e.g. a patterned separation layer 230a). It is understood that separation layer 230a is a portion of separation layer 230. In one or more embodiments, the separation layer 230 may be etched to form the separation layer 230a. In one or more embodiments, the separation layer 230 may be etched using a wet etching process and/or a dry etching process. In one or more embodiments, the wet etching process may use a wet etchant which may etch the separation layer 230 selective to the conductive layer 240a (and optionally also selective to the barrier layer 220). In one or more embodiments, the etching process may stop essentially on the barrier layer 220. In one or more embodiments, essentially none of the barrier layer 220 may be etched. An example of a wet etchant for etching the separation layer 230 may be hydrogen fluoride (e.g. diluted hydrogen fluoride).

In one or more embodiments, the width of the separation layer 230a may be substantially the same as the width of the conductive layer 240a.

Figure 5:
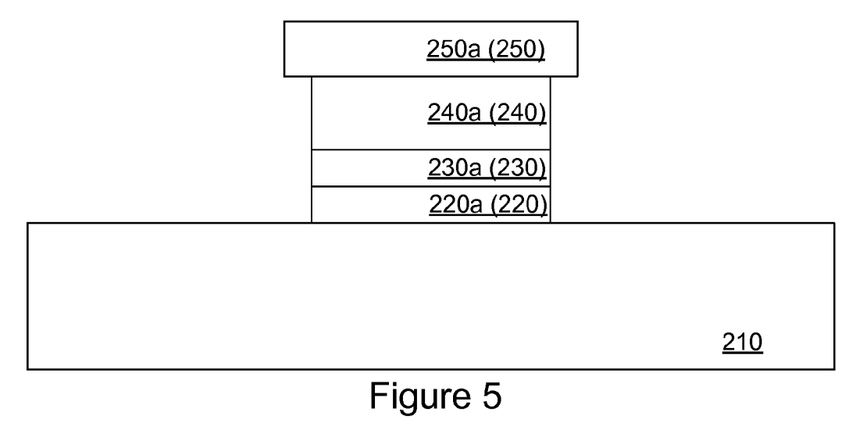
FIG. 5 shows the result of patterning the barrier layer of the structure shown in FIG. 4.

Referring to FIG. 5, after the patterning (e.g. etching) of the separation layer 230 to form separation layer 230a, the barrier layer 220 may be patterned to form the barrier layer 220a which is a portion of barrier layer 220. Hence, the barrier layer 220a may be a patterned barrier layer 220a. In one or more embodiments, the barrier layer 220 may be etched. The etching process may include a wet etching process and/or a dry etching process. In one or more embodiments, the etching process may stop essentially on the workpiece 210.

In one or more embodiments, the width of the barrier layer 220a may be substantially the same as the width the separation layer 230a.

Figure 6:
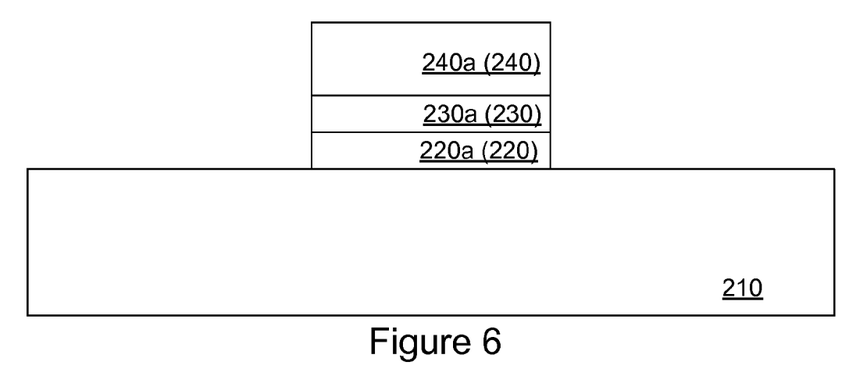
FIG. 6 shows the result of removing the mask from the structure shown in FIG. 5.

Referring to FIG. 6, after the etch of the barrier layer 220 to form the barrier layer 220a, the mask 250a may be removed. In other embodiments, the mask 250a may be removed after the etch of the conductive layer 240 or after the etch of the separation layer 230.

In is noted that the structure shown in FIG. 6 may represent a semiconductor structure. The semiconductor structure may, for example, be part of a semiconductor device, semiconductor chip and/or integrated circuit. In one or more embodiments, the conductive layer 240a may, for example, represent a conductive line (e.g. a metal line) belonging to a metallization level of semiconductor chip and/or integrated circuit. The conductive line (e.g. metal line) may include a pad structure (such as a landing pad, bond pad or contact pad). The metallization level may be any metallization level, such as metal-1, metal-2, metal-3, all the way up to and including the final metal level. It is understood that, in one or more embodiments, the conductive layer 240a may represent other features as well.

Referring to FIG. 6, the workpiece 210 may, for example, represent a substrate (or the workpiece 210 may include a substrate). The substrate may be a semiconductor substrate. The semiconductor substrate may be a bulk-semiconductor substrate (e.g. a bulk-semiconductor wafer). The bulk-semiconductor substrate may be a bulk-silicon substrate (e.g. a bulk-silicon wafer). The semiconductor substrate may be an SOI substrate (e.g. an SOI substrate). The SOI substrate may include a bulk-semiconductor substrate, an insulator layer overlying the bulk-semiconductor substrate and a semiconductor layer overlying the insulator layer. An example of an SOI substrate is a silicon-on-insulator substrate.

In one or more embodiments, the workpiece 210 may, for example, comprise a dielectric material, for example, of an inter-level dielectric layer. In one or more embodiments, the workpiece 210 may consist essentially of a dielectric material or may be a dielectric layer. In one or more embodiments, the workpiece 210 may include or may be an inter-level dielectric layer.

In one or more embodiments, the workpiece 210 may represent (or may include) a plastic substrate such as an eWLB plastic wafer. In one or more embodiments, the workpiece 210 may represent (or may include) a leadframe substrate.

Hence, in one or more embodiments, the layers 220, 230, 240, and 250 may be formed over a substrate (e.g. semiconductor substrate or other substrate).

Figure 7:
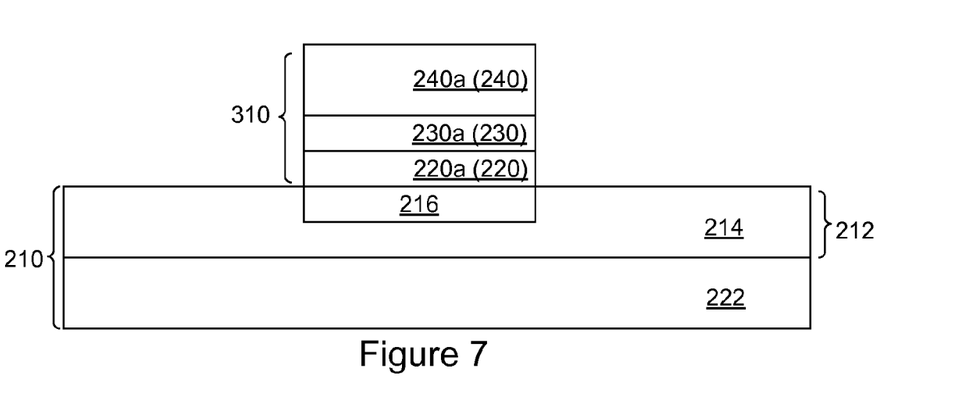
FIG. 7 shows a semiconductor structure in accordance with an embodiment of the present invention.

FIG. 7 shows that the workpiece 210 may represent a layer 212 overlying a substrate 222 (e.g. a semiconductor substrate). In one or more embodiments, the layer 212 may, for example, represent an inter-level dielectric layer 214 that includes at least one metal line 216 embedded within the inter-level dielectric layer 214. The metal line 216 may, for example, be part of a metallization level below the metallization level of conductive layer 240a (which may be a conductive line such as a metal line). The metallization level of metal line 216 may, for example, be any metallization level such as Metal-1, Metal-2, etc. Hence, in one or more embodiments, the conductive layer 240a (which may be a conductive line such as a metal line) may be part of any metallization level. In other embodiments, the workpiece 210 may include one or more additional inter-level dielectric layers (and one or more metallization levels) between inter-level dielectric layer 214 and the substrate 222.

Referring to FIG. 7 (or to FIG. 6), as an optional subsequent processing step, the stack of layers 220a, 230a, 240a may be covered with a dielectric layer or passivation layer. In one or more embodiments, a passivation layer may comprise a dielectric material. After the dielectric (or passivation) layer is formed, an opening may be formed in the dielectric (or passivation) layer to expose the conductive layer 240a.

Referring to FIG. 7, the stack of layers 220a, 230a, 240a may, in one or more embodiments, represent an interconnect stack 310. Hence, in one or more embodiments, an interconnect stack 310 may be formed comprising the layers 220a, 230a and 240a. In one or more embodiments, an interconnect stack 310 comprising the layers 220a, 230a, 240a may be useful in directing electrical signals primarily in a horizontal direction.

In one or more embodiments, the widths of the layers 220a, 230a and 240a may all be substantially the same. In one or more embodiments, the lateral dimensions of the layers 220a, 230a and 240a may all be substantially the same.

In one or more embodiments, a metallization level may include one or more interconnect stacks 310. In one or more embodiments, a metallization level may include a plurality of interconnect stacks 310. In one or more embodiments, two or more of the interconnect stacks may be spaced apart from each other. In one or more embodiments, two or more of the interconnect stacks 310 may be electrically isolated from each other. As noted, the conductive layer 240a may be a conductive line (for example, a metal line). However, it is also possible that the conductive layer 240a serve as some other conductive feature.

One or more embodiments relate to a method for making a semiconductor structure, comprising: providing a workpiece; forming a barrier layer over the workpiece; forming a separation layer over the barrier layer; forming a conductive layer over the separation layer; and wet etching the conductive layer. In one or more embodiments, the conductive layer may be a metallic layer.

One or more embodiments, relate to a method for making a semiconductor structure, comprising: providing a workpiece; forming a barrier layer over the workpiece, the barrier layer comprising W (tungsten); forming a separation layer over the first layer, the separation layer essentially lacking W (tungsten); forming a conductive layer over the second layer, the conductive layer comprises Cu (copper); and wet etching the conductive layer. In one or more embodiments, the conductive layer may be a metallic layer.

One or more embodiments relate to a method for making a semiconductor structure, comprising: providing a conductive layer, the conductive layer comprising Cu (copper); and wet etching said conductive layer while essentially no W (tungsten) directly contacts the conductive layer. In one or more embodiments, the conductive layer may be a metallic layer.

One or more embodiments, relate to a semiconductor structure, comprising: a workpiece; a barrier layer overlying the workpiece, the barrier layer comprising; a separation layer overlying said barrier layer, the separation layer essentially lacking W (tungsten); and a conductive layer overlying the separation layer.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method for making a semiconductor structure, comprising:
   forming a barrier layer over a workpiece, said barrier layer comprising the chemical element W (tungsten);
   forming a separation layer over and in direct contact with said barrier layer, said separation layer essentially lacking the chemical element W (tungsten), said separation layer comprising at least one material from the group consisting of titanium metal, titanium alloy, titanium nitride, tantalum metal, tantalum alloy, or tantalum nitride;
   forming a conductive layer over and in direct contact with said separation layer, said conductive layer comprising the chemical element Cu (copper), wherein the conductive layer comprises more than 50% atomic percentage of copper; and
   wet etching said conductive layer selectively and stopping on the separation layer, wherein the wet etching is performed using an etchant that is chosen to be selective between the conductive layer and the separation layer, the etchant including phosphoric acid, acetic acid and nitric acid; and
   patterning the separation layer after wet etching the conductive layer.

2. The method of claim 1, wherein said barrier layer comprises titanium-tungsten alloy.

3. The method of claim 1, wherein, before wet etching said conductive layer, forming a mask over said conductive layer.

4. The method of claim 1, wherein the chemical element Cu (copper) is in the form of at least one of copper metal or copper alloy.

5. The method of claim 1, wherein the conductive layer comprises copper metal.

6. The method of claim 1, wherein said separation layer comprises at least one of titanium metal, titanium alloy, tantalum metal or tantalum alloy.

7. The method of claim 1, wherein said separation layer comprises at least one of titanium metal or titanium alloy.

8. The method of claim 1, wherein said etchant includes 49% phosphoric acid, 35% acetic acid and 1.5% nitric acid.

9. A method for making a semiconductor structure, the method comprising:
   providing a semiconductor substrate, a top surface of the substrate comprising an inter-level dielectric layer;

forming a barrier layer over and in direct contact with the inter-level dielectric layer, the barrier layer comprising the chemical element W (tungsten);

forming a separation layer over and in direct contact with the barrier layer, the separation layer essentially lacking the chemical element W (tungsten);

forming a conductive layer over and in direct contact with the separation layer the conductive layer comprising the chemical element Cu (copper), wherein the conductive layer comprises more than 50% atomic percentage of copper;

forming a mask layer over the conductive layer;

patterning the mask layer; and forming a plurality of metallization lines that are spaced apart electrically isolated from each other by:

using a first etching process that uses a first etchant, wet etching the conductive layer selectively and stopping on the separation layer, using a second etching process that uses a second etchant different from the first etchant, patterning the separation layer selectively with respect to the etched conductive layer, wherein the metallization lines include a first electrical signal line for directing electrical signals in a horizontal direction relative to the top surface of the substrate and a second electrical signal line for directing electrical signals in the horizontal direction.

10. The method of claim 9, further comprising forming a second plurality of metallization lines over the plurality of metallization lines.

11. The method of claim 9, wherein forming the conductive layer comprises forming a conductive layer having a thickness between 500 and 1500 nm.

12. The method of claim 9, wherein the separation layer comprises at least one material selected from the group consisting of titanium metal, titanium alloy, titanium nitride, tantalum metal, tantalum alloy, and tantalum nitride.

13. The method of claim 12, wherein the separation layer comprises at least one material selected from the group consisting of titanium metal, titanium alloy, tantalum metal or tantalum alloy.

14. The method of claim 9, wherein the barrier layer comprises titanium-tungsten alloy.

15. The method of claim 9, wherein the separation layer comprises at least one of titanium metal or titanium alloy.

16. The method of claim 9, wherein the first etchant includes phosphoric acid.

17. The method of claim 16, wherein the first etchant includes phosphoric acid, acetic acid and nitric acid.

18. The method of claim 17, wherein the first etchant comprises about 49% phosphoric acid, 35% acetic acid and 1.5% nitric acid.

19. The method of claim 17, wherein the second etchant comprises hydrogen fluoride.

20. A method for making a semiconductor structure, the method comprising:

providing a semiconductor substrate, a top surface of the substrate comprising an inter-level dielectric layer;

forming a barrier layer having a thickness between 5 nm and 300 nm over and in direct contact with the inter-level dielectric layer, the barrier layer comprising the chemical element W (tungsten);

forming a separation layer having a thickness between 10 nm and 500 nm over and in direct contact with the barrier layer, the separation layer essentially lacking the chemical element W (tungsten);

forming a conductive layer having a thickness between 500 nm and 1500 nm over and in direct contact with the separation layer the conductive layer comprising the chemical element Cu (copper), wherein the conductive layer comprises more than 50% atomic percentage of copper;

forming a mask layer over the conductive layer;

patterning the mask layer;

forming a plurality of metallization lines that are spaced apart electrically isolated from each other by using a first etching process that uses a first etchant comprising phosphoric acid, acetic acid, and nitric acid, wet etching the conductive layer selectively and stopping on the separation layer, using a second etching process that uses a second etchant comprising hydrofluoric acid, patterning the separation layer selectively with respect to the etched conductive layer, the metallization lines including a first electrical signal line for directing electrical signals in a horizontal direction relative to the top surface of the substrate and a second electrical signal line for directing electrical signals in the horizontal direction; and forming a second plurality of metallization lines overlying the plurality of metallization lines.

* * * * *